(12) United States Patent
Mitani et al.

(10) Patent No.: US 8,608,978 B2
(45) Date of Patent: Dec. 17, 2013

(54) CERAMIC COMPOSITE LIGHT-CONVERTING MEMBER AND LIGHT-EMITTING DEVICE USING THE SAME

(75) Inventors: Atsuyuki Mitani, Ube (JP); Shin-ichi Sakata, Ube (JP)

(73) Assignee: Ube Industries, Ltd. (JP)

( * ) Notice: Subject to any disclaimer, the term of this patent is extended or adjusted under 35 U.S.C. 154(b) by 1158 days.

(21) Appl. No.: 12/161,403

(22) PCT Filed: Jan. 18, 2007

(86) PCT No.: PCT/JP2007/051108
§ 371 (c)(1),
(2), (4) Date: Jul. 18, 2008

(87) PCT Pub. No.: WO2007/083828
PCT Pub. Date: Jul. 26, 2007

(65) Prior Publication Data
US 2010/0231120 A1  Sep. 16, 2010

(30) Foreign Application Priority Data

Jan. 19, 2006 (JP) ................... 2006-010593
Jan. 19, 2006 (JP) ................... 2006-010594

(51) Int. Cl.
C09K 11/02 (2006.01)
C09K 11/77 (2006.01)
C09K 11/08 (2006.01)
H01J 1/62 (2006.01)
H01J 63/04 (2006.01)

(52) U.S. Cl.
USPC .................. 252/301.4 R; 313/503

(58) Field of Classification Search
USPC .................. 252/301.4 R; 313/503
See application file for complete search history.

(56) References Cited

U.S. PATENT DOCUMENTS

| 5,484,752 | A | 1/1996 | Waku et al. |
| 5,569,547 | A | 10/1996 | Waku et al. |
| 5,902,763 | A | 5/1999 | Waku et al. |
| 5,981,415 | A | 11/1999 | Waku et al. |
| 6,608,332 | B2 * | 8/2003 | Shimizu et al. ................. 257/98 |
| 2006/0124951 | A1 * | 6/2006 | Sakata et al. .................... 257/99 |

FOREIGN PATENT DOCUMENTS

| EP | 1 588 991 A1 | 10/2005 |
| JP | 7-149597 A | 6/1995 |
| JP | 7-187893 A | 7/1995 |
| JP | 8-81257 A | 3/1996 |
| JP | 8-253389 A | 10/1996 |
| JP | 8-253390 A | 10/1996 |
| JP | 9-67194 A | 3/1997 |
| JP | 10-17396 | 1/1998 |
| JP | 10-17396 A | 1/1998 |
| JP | 2000-208815 A | 7/2000 |
| JP | 2002-050800 A | 2/2002 |
| JP | 2002-208740 A | 7/2002 |
| JP | 2002-335010 A | 11/2002 |
| JP | 3503139 B2 | 12/2003 |
| JP | 2005-264062 A | 9/2005 |
| TW | 2004/25540 A | 11/2004 |
| WO | 2004/065324 A1 | 8/2004 |
| WO | WO2004/065324 | * 8/2004 |

OTHER PUBLICATIONS

Park. Fracture Behavior of directionally solidified CeO2 and Pr2O3 doped Y3Al5O12/Al2O3 eutectic composites. Materials Science and Enginerring A332 (2002) 276-284.*
Young-Duk Huh et al., "The Optical Properties of $(Y_{1-x}Gd_x)_{3-z}(Al_{1-y}Ga_y)_5O_{Ce2}$ Phosphors for White LED," *Bull. Korean Chem. Soc.* (2002), vol. 23, No. 10, 1435-1437.
Oyo Butsuri (Applied Physics), pp. 1518-1522, vol. 71, No. 12 (2002).
Masatsugu Ichikawa et al., "The Present State and the Future of White LED Using Rare Earth Phosphor," Material Integration, pp. 446, vol. 16, No. 7 (2003).
Yuexiao Pan et al., "Tailored phtoluminescence of YAG:Ce phosphor through various methods," Journal of Physics and Chemistry of Solids, pp. 845-850, vol. 65 (2004).

* cited by examiner

*Primary Examiner* — Carol M Koslow
*Assistant Examiner* — Matthew E Hoban
(74) *Attorney, Agent, or Firm* — DLA Piper LLP (US)

(57) ABSTRACT

The present invention relates to a ceramic composite light-converting member which is a solidified body having a texture of at least two or more oxide phases being continuously and three-dimensionally entangled with each other, where at least one of the oxide phases is a fluorescence-emitting phase and the composition as a whole is represented by:

$$x.AlO_{3/2}\text{-}y.(a.YO_{3/2}\text{-}b.GdO_{3/2}\text{-}c.CeO_2)$$

[wherein x, y, a, b and c are each a molar fraction and satisfy $0.750 < x < 0.850$, $0 < b < 0.8$, $0 < c < 0.3$, $x+y=1$ and $a+b+c=1$]; or $$x.AlO_{3/2}\text{-}y.(a.YO_{3/2}\text{-}c.CeO_2)$$

(wherein x, y, a, b and c are each a molar fraction and satisfy $0.750 < x < 0.850$, $0.125 \leq c < 0.3$, $x+y=1$ and $a+c=1$).

The ceramic composite light-converting member enables emitting light adjusted to a peak wavelength of 540 to 580 nm and fabricating a high-efficiency white light-emitting device by combining it with a blue light-emitting element.

10 Claims, 7 Drawing Sheets

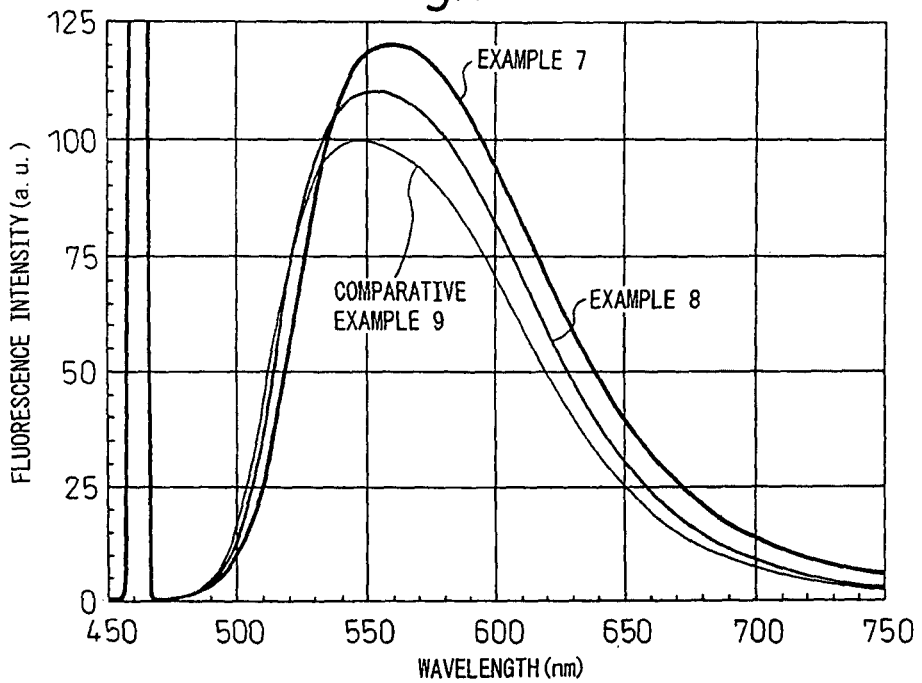
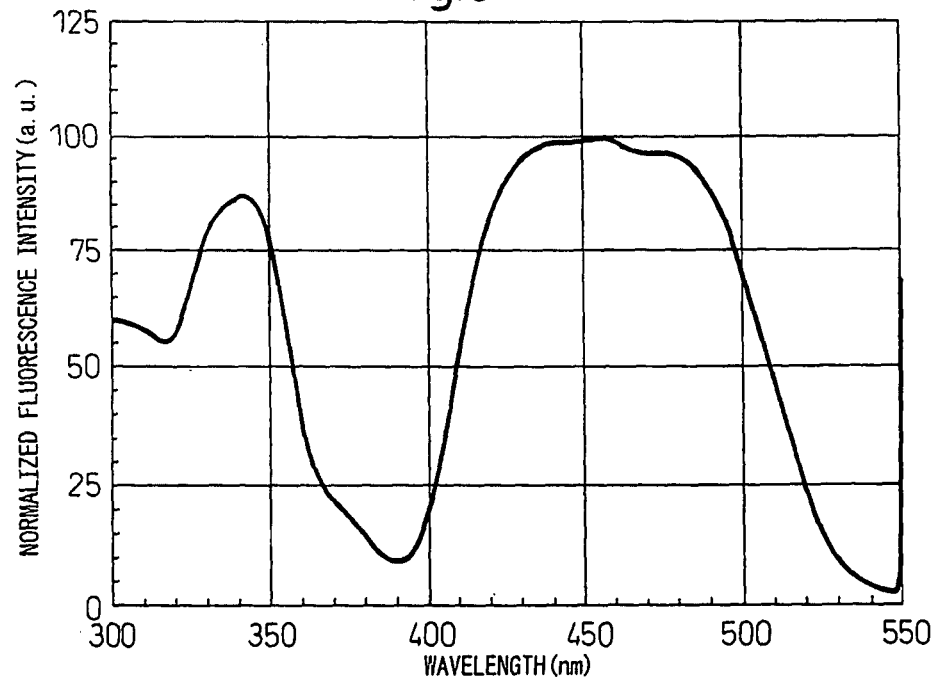

CERAMIC COMPOSITE LIGHT-CONVERTING MEMBER AND LIGHT-EMITTING DEVICE USING THE SAME

TECHNICAL FIELD

The present invention relates to a light-emitting device such as a light-emitting diode, which can be used in a display, a light, a backlight source and the like. More specifically, the present invention relates to a ceramic composite light-converting member as a light conversion member for obtaining fluorescence by utilizing irradiation light, and a light-emitting device using the ceramic composite light-converting member.

BACKGROUND ART

In recent years, studies have been aggressively made to develop a white light-emitting device using a blue light-emitting element as a light-emitting source. In particular, a white light-emitting diode using a blue light-emitting diode is lightweight, uses no mercury lamp and has long life, and therefore demands thereof are expected to rapidly expand in the future. A most commonly employed method for converting the blue light of a blue light-emitting element into white light is a method of obtaining a pseudo-white color by mixing a blue color and a yellow color which are in a complementary relationship. For example, as described in Japanese Unexamined Patent Publication (Kokai) No. 2000-208815, a coating layer containing a fluorescent material for emitting yellow light by absorbing a part of blue light is provided on the front surface of a light-emitting diode which emits blue light, and a mold layer or the like for mixing blue light of the light source and yellow light from the florescent material is provided ahead of the coating layer, whereby a white light-emitting diode can be fabricated. As for the fluorescent material, a cerium-activated YAG ($Y_3Al_5O_{12}$) (hereinafter referred to as "YAG:Ce") powder or the like is used.

However, in the structure of a white light-emitting diode generally used at present as typified by Japanese Unexamined Patent Publication (Kokai) No. 2000-208815, the fluorescent material powder is mixed with a resin such as epoxy and then coated, and therefore, uniformity of the mixed state of the fluorescent material powder with the resin and stabilizing the thickness of the coated film is difficult and color unevenness or fluctuation of the white light-emitting diode readily occurs. Furthermore, the resin required in using a fluorescent material powder is poor in heat resistance compared with metals or ceramics, and may cause a reduction in the transmittance resulting from alteration due to heat from the light-emitting element, which hampers high output of the white light-emitting diode.

The present inventors have proposed a ceramic composite light-converting member comprising a solidified body in which a plurality of oxide phases containing a fluorescence-emitting $(Y,Ce)_3Al_5O_{12}$ phase and an $Al_2O_3$ phase are formed to be continuously and three-dimensionally entangled with each other, and a white light-emitting device fabricated using a blue-to-violet light-emitting element and the ceramic composite light-converting member above. This ceramic composite light-converting member enables obtaining homogeneous yellow fluorescence by virtue of uniform distribution of the fluorescence-emitting phase and is excellent in heat resistance because the member is ceramic. Furthermore, the ceramic composite itself is a bulk body and requires no resin for the fabrication of a white light-emitting device, so that the fluorescence intensity can be easily controlled by the thickness and in turn, the white light-emitting light using this light-converting member can be reduced in the color unevenness or fluctuation, which is very advantageous for achieving high output.

In such a white light-emitting device using a blue light-emitting element and a YAG:Ce yellow florescent material, the light of the blue light-emitting element generally employed at present is blue having a peak wavelength in the vicinity of 460 nm (for example, x=0.135 and y=0.08 in the CIE 1931 chromaticity coordinates (hereinafter referred to as "chromaticity coordinates")). This is because the emission efficiency of the YAG:Ce fluorescent material becomes high in this wavelength region. On the other hand, the color of fluorescence of the YAG:Ce fluorescent material of which emission wavelength is not adjusted (hereinafter referred to as "unadjusted YAG:Ce") is yellow having a peak wavelength in the vicinity of 530 to 545 nm (for example, x=0.41 and y=0.56 in the chromaticity coordinates). Accordingly, when light from the light-emitting element at 460 nm and light from the unadjusted YAG:Ce fluorescent material are mixed, the color is shifted to the green side from white (for example, 6,000 K, x=0.32 and y=0.34 in the chromaticity coordinates). In order to obtain a white color by this construction, a fluorescent material which emits fluorescence having a peak wavelength in the more red side (longer wavelength side) has to be used.

It is well known that the YAG:Ce fluorescent material can shift the peak of its fluorescence wavelength to the long wavelength side by partially replacing, for example, the Y element by a Gd element (see, *Material Integration*, pp. 41-46, Vol. 16, No. 7 (2003); and *Oyo Butsuri (Applied Physics)*, pp. 1518-1522, Vol. 71, No. 12 (2002)). Japanese Patent No. 3,503,139 has proposed a method for obtaining a white color (x=0.33 and y=0.33 in the CIE chromaticity coordinates), where a white light-emitting diode is fabricated by combining a blue light-emitting diode with a YAG:Ce fluorescent material having a fluorescence wavelength adjusted as above to the long wavelength side (hereinafter referred to as "adjusted YAG:Ce").

However, generally in the fluorescent powder conventionally used, the emission efficiency of the adjusted YAG:Ce is known to decrease in comparison with the unadjusted YAG:Ce as described, for example, in the publication above (*Material Integration*, pp. 41-46, Vol. 16, No. 7 (2003)), and a white light-emitting diode fabricated using this fluorescent material has a problem that the emission efficiency decreases. For the fabrication of a high-efficiency white light-emitting diode which is increasingly desired in the future, a light conversion material capable of keeping the emission efficiency high and at the same time, emitting fluorescence adjusted to an optimal wavelength for the emission wavelength of a blue light-emitting element combined is demanded.

A first object of the present invention is to provide a light conversion member ensuring that fluorescence adjusted to a peak wavelength of 540 to 580 nm can be efficiently emitted and the obtained fluorescence is homogeneous, and being excellent in the heat resistance and durability and suitable for the fabrication of a high-efficiency white light-emitting device by combining it with a blue light-emitting element; and a white light-emitting device using this light conversion material and a blue-to-violet light-emitting element, in which light can be adjusted to a white color, color unevenness or fluctuation is reduced and deterioration or the like does not occur because a resin is not necessarily required for the fabrication and which is very suitable for achieving high output and is highly efficient.

It is also well known that the YAG:Ce fluorescent material can shift the peak of the fluorescence wavelength to the long wavelength side by increasing the amount of the activator Ce (see, *J. Physics and Chemistry of Solids*, pp. 845-850, Vol. 65 (2004)). By this technique, the peak of the fluorescence wavelength can be shifted to the vicinity of 560 nm.

However, generally in the fluorescent material conventionally used, when the fluorescence peak wavelength is shifted to the long wavelength side by increasing the amount of the activator Ce as described in the publication above (*J. Physics and Chemistry of Solids*, pp. 845-850, Vol. 65 (2004)), there arises a problem that fluorescence intensity decreases due to concentration quenching if the peak wavelength exceeds 550 nm. Therefore, a white light-emitting diode fabricated using this fluorescent material is caused to decrease in the emission efficiency and the technique above cannot be practically used for the control of fluorescence wavelength. For the fabrication of a high-efficiency white light-emitting diode which is increasingly desired in the future, a light conversion material capable of keeping the emission efficiency high and at the same time, emitting fluorescence adjusted to an optimal wavelength for the emission wavelength of a blue light-emitting element combined is demanded.

A second object of the present invention is to provide a light conversion material ensuring that fluorescence adjusted to a peak wavelength of 550 to 560 nm can be efficiently emitted and the obtained fluorescence is homogeneous, and being excellent in heat resistance and durability, and suitable for the fabrication of a high-efficiency white light-emitting device by combining it with a blue light-emitting element; and a white light-emitting device using this light conversion material and a blue-to-violet light-emitting element, in which light can be adjusted to a white color, color unevenness or fluctuation is reduced and deterioration or the like does not occur because a resin is not required for the fabrication, and which is very suitable for achieving high output and is highly efficient.

SUMMARY OF THE INVENTION

The present inventors have found that when a certain kind of a ceramic composite is used as the light-converting member, the wavelength of the fluorescence peak can be adjusted and controlled while suppressing the reduction of fluorescence intensity. The present invention has been accomplished based on this finding.

In other words, the present invention relates to a ceramic composite light-converting member which is a solidified body having a texture of at least two or more oxide phases being continuously and three-dimensionally entangled with each other, where at least one of the oxide phases is a fluorescence-emitting phase and the composition as a whole is represented by:

$x.AlO_{3/2}\text{-}y.(a.YO_{3/2}\text{-}b.GdO_{3/2}\text{-}c.CeO_2)$ (wherein x, y, a, b and c are each a molar fraction and satisfy 0.750<x<0.850, 0<b<0.8, 0<c<0.3, x+y=1 and a+b+c=1); or $x.AlO_{3/2}\text{-}y.(a.YO_{3/2}\text{-}c.CeO_2)$ (wherein x, y, a and c are each a molar fraction and satisfy 0.750<x<0.850, 0.125≤c<0.3, x+y=1 and a+c=1).

Also, the present invention relates to a method for producing a ceramic composite light-converting member, comprising steps of mixing an Al oxide, a Y oxide, a Ce oxide and a Gd oxide at a ratio of:

$x.AlO_{3/2}\text{-}y.(a.YO_{3/2}\text{-}b.GdO_{3/2}\text{-}c.CeO_2)$ (wherein x, y, a, b and c are each a molar fraction and satisfy 0.750<x<0.850, 0<b<0.8, 0<c<0.3, x+y=1 and a+b+c=1); or $x.AlO_{3/2}\text{-}y.(a.YO_{3/2}\text{-}c.CeO_2)$ (wherein x, y, a and c are each a molar fraction and satisfy 0.750<x<0.850, 0.125≤c<0.3, x+y=1 and a+c=1), melting the mixture, and solidifying the melt.

The present invention also relates to a light-emitting device comprising the above-described ceramic composite light-converting member and a light-emitting element.

One embodiment of the light-emitting device is a white light-emitting device comprising a light-emitting element, which emits light having a peak at a wavelength of 400 to 520 nm and the above-described ceramic composite light-converting member which emits fluorescence having a peak at a wavelength of 540 to 580 nm or 550 to 560 nm. One embodiment of the light-emitting device is this white light-emitting device where the light-emitting element is a light-emitting diode element.

By using the ceramic composite light-converting member of the present invention, yellow fluorescence adjusted to a peak wavelength of 540 to 580 nm or a peak wavelength of 550 to 560 nm by excitation light at a wavelength of 400 to 520 nm can be obtained while keeping high efficiency without causing decrease in the fluorescence intensity. Wavelength-adjusted homogeneous yellow fluorescent can also be obtained from uniformly distributed fluorescence-emitting phases and the heat resistance and durability are excellent because of a ceramic, so that a light conversion material suitable for the fabrication of a high-efficiency white light-emitting device by combining it with a blue light-emitting element can be provided. Furthermore, by the light-emitting device comprising a blue-to-violet light-emitting element and a ceramic composite light-converting member of the present invention, a white light-emitting device in which light can be adjusted to a white color, color unevenness or fluctuation is reduced, and deterioration due to heat or light does not occur because the ceramic composite light-converting member itself is a bulk body not requiring a sealing resin and which is very suitable for achieving high output and high efficiency, can be provided.

BRIEF DESCRIPTION OF THE DRAWINGS

FIG. 7 is a fluorescence spectrum of Example 7 showing one example of the fluorescence characteristics of the ceramic composite for light conversion of the present invention.

FIG. 8 is an excitation spectrum of Example 7 showing one example of the fluorescence characteristics of the ceramic composite for light conversion of the present invention.

BEST MODE FOR CARRYING OUT THE INVENTION

Figure 1:
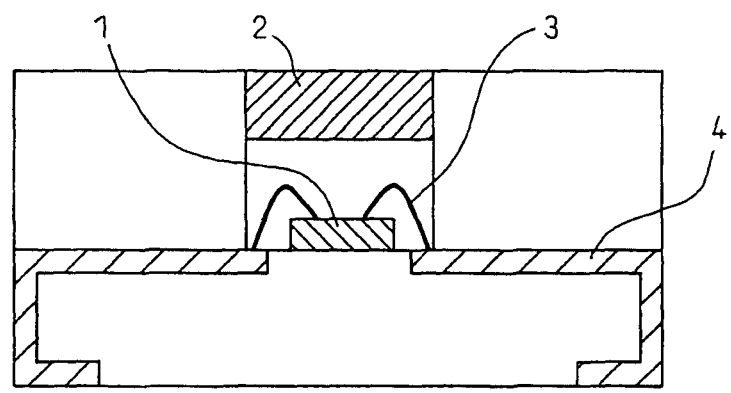
FIG. 1 is a schematic cross-sectional view showing one embodiment of the light-emitting device of the present invention. In the Figure, 1 is a ceramic composite light-converting member, 2 is a light-emitting element (light-emitting diode element), 3 is a lead wire, and 4 is a lead electrode.

The present invention is described in detail below.

The ceramic composite light-converting member of the present invention is a solidified body having a texture of at least two or more oxide phases being continuously and three-dimensionally entangled with each other, where at least one of the oxide phases is a fluorescence-emitting phase. The composition of the ceramic composite light-converting member as a whole is represented by:

$$x \cdot AlO_{3/2} \text{-} y \cdot (a \cdot YO_{3/2} \text{-} b \cdot GdO_{3/2} \text{-} c \cdot CeO_2)$$

(wherein x, y, a, b and c are each a molar fraction and satisfy $0.750<x<0.850$, $0<b<0.8$, $0<c<0.3$, $x+y=1$ and $a+b+c=1$); or $$x \cdot AlO_{3/2} \text{-} y \cdot (a \cdot YO_{3/2} \text{-} c \cdot CeO_2)$$

(wherein x, y, a and c are each a molar fraction and satisfy $0.750<x<0.850$, $0.125 \leq c<0.3$, $x+y=1$ and $a+c=1$). Fluorescence can be emitted by allowing excitation light to enter the ceramic composite light-converting member.

First, the case where the ceramic composite is represented by:

$$x \cdot AlO_{3/2} \text{-} y \cdot (a \cdot YO_{3/2} \text{-} b \cdot GdO_{3/2} \text{-} c \cdot CeO_2)$$

(wherein x, y, a, b and c are each a molar fraction and satisfy $0.750<x<0.850$, $0<b<0.8$, $0<c<0.3$, $x+y=1$ and $a+b+c=1$) is described.

The value of x in the compositional formula is limited to the range above, because if it becomes 0.75 or less or 0.85 or more, a good solidified body having no cracks is difficult to obtain. The value of b in the compositional formula is limited to the range above, because if it becomes 0.8 or more, the intensity of fluorescence decreases. The value of c in the compositional formula is limited to the range above, because if it is 0, fluorescence cannot be obtained and if it is 0.3 or more, a good solidified body having no cracks is difficult to obtain.

The oxide phase varies according to the composition and production conditions of the solidified body, but examples thereof include an $Al_2O_3$ phase, a $(Y,Gd,Ce)_3Al_5O_{12}$ phase, a $(Y,Gd,Ce)AlO_3$ phase, a $(Y,Gd,Ce)_4Al_2O_9$ phase, a $CeAl_{11}O_{18}$ phase, a $Y_2O_3$ phase, a $Gd_2O_3$ phase and a $CeO_2$ phase. At least two or more phases of these oxide phases are contained. The solidified body has a structure where out of oxide phases contained, at least two phases are continuously and three-dimensionally entangled with each other. A part of the oxide phase is sometimes present like particles in the mutually entangled structure formed by other oxide phases. In any case, at the boundary of respective phases, a boundary layer such as amorphous phase is not present and the oxide phases are directly contacted with each other. Therefore, light is less lost in the ceramic composite light-converting member and the light transmittance is high.

Examples of the fluorescence-emitting phase include, out of the above-described oxide phases, a $(Y,Gd,Ce)_3Al_5O_{12}$ phase and a $(Y,Gd,Ce)AlO_3$ phase, and at least one of these fluorescence-emitting phases is contained. The solidified body takes a structure where oxide phases including such a fluorescence-emitting phase are continuously and three-dimensionally entangled with each other, and each oxide phase is as a whole uniformly distributed in the ceramic composite light-converting member, so that homogeneous fluorescence without partial disproportionation can be obtained.

This ceramic composite light-converting member of the present invention enables obtaining yellow fluorescence having a peak wavelength of 540 to 580 nm by the use of at least a blue-to-violet excitation light at a wavelength of 400 to 520 nm. Fluorescence having an intensity of about 70% of the maximum intensity and fluorescence having an almost maximum intensity can be obtained by the use of excitation light at a wavelength of 420 to 500 nm and a wavelength of 440 to 480 nm, respectively. Furthermore, fluorescence can also be emitted by the use of near ultraviolet light at a wavelength of 300 to 360 nm. The peak wavelength of fluorescence slightly varies depending on the measuring instrument used, correction conditions or the like, and for the measurement of fluorescence in this claimed invention, a solid quantum efficiency measuring apparatus where an integrating sphere is combined with FP6500 manufactured by JASCO Corp. is used. As for the fluorescence correction, the correction is performed using a secondary standard light source.

The peak wavelength of yellow fluorescence emitted from this ceramic composite light-converting member can be controlled by the composition. The peak wavelength of yellow fluorescence can be shifted to the long wavelength side by incorporating $GdO_{3/2}$ into the composition. With a constant molar fraction of $CeO_2$, as the molar fraction of $GdO_{3/2}$ is higher, the peak wavelength is shifted to a longer wavelength side. With a constant molar fraction of $GdO_{3/2}$, as the molar fraction of $CeO_2$ is higher, the peak wavelength is shifted to a longer wavelength side. In the case where the same peak wavelength is obtained, a composition having a higher molar fraction of $CeO_2$ is preferred because higher fluorescence intensity is obtained. Furthermore, by selecting an optimal ratio between two elemental components $GdO_{3/2}$ and $CeO_2$, yellow fluorescence having a peak wavelength of 580 nm can be obtained without causing reduction in the fluorescence intensity. This ceramic composite light-converting member can synergistically exert the effects of two elemental components $GdO_{3/2}$ and $CeO_2$ on the fluorescence characteristics, so that yellow fluorescence allowing for arbitrary adjustment of the peak wavelength in the range of 540 to 580 nm and having strong intensity, which is unobtainable by the conventional adjusted YAG:Ce fluorescent material powder, can be obtained.

Next, a case where the ceramic composite is represented by:

$$x \cdot AlO_{3/2} \text{-} y \cdot (a \cdot YO_{3/2} \text{-} c \cdot CeO_2)$$

(wherein x, y, a and c are each a molar fraction and satisfy $0.750<x<0.850$, $0.1255 \leq c<0.3$, $x+y=1$ and $a+c=1$) will be described.

The value of x in the compositional formula is limited to the range above, because if it becomes 0.75 or less or 0.85 or more, a good solidified body having no cracks is difficult to obtain. The value of c in the compositional formula is limited to the range above, because if it is less than 0.125, the peak wavelength of fluorescence becomes shorter than 550 nm and if it is 0.3 or more, a good solidified body having no cracks can be hardly obtained.

The oxide phase varies according to the composition and production conditions of the solidified body, but examples thereof include an $Al_2O_3$ phase, a $(Y,Ce)_3Al_5O_{12}$ phase, a $(Y,Ce)AlO_3$ phase, a $(Y,Ce)_4Al_2O_9$ phase, a $CeAl_{11}O_{18}$ phase, a $Y_2O_3$ phase and a $CeO_2$ phase. At least two or more phases of these oxide phases are contained. The solidified body has a structure where out of oxide phases contained, at least two phases are continuously and three-dimensionally entangled with each other. A part of the oxide phase is sometimes present like particles in the mutually entangled structure formed by other oxide phases. In any case, at the boundary of respective phases, a boundary layer such as amorphous phase is not present and the oxide phases are directly contacted with each other. Therefore, light is lost less in the ceramic composite for light conversion and the light transmittance is high.

Examples of the fluorescence-emitting phase include, out of the above-described oxide phases, a $(Y,Ce)_3Al_5O_{12}$ phase and a $(Y,Ce)AlO_3$ phase, and at least one of these fluorescence-emitting phases is contained. The solidified body takes a structure where oxide phases including such a fluorescence-emitting phase are continuously and three-dimensionally entangled with each other, and each oxide phase is as a whole uniformly distributed in the ceramic composite for light conversion, so that homogeneous fluorescence without partial disproportionation can be obtained.

This ceramic composite for light conversion of the present invention enables obtaining yellow fluorescence having a peak wavelength of 550 to 560 nm by the use of at least a blue-to-violet excitation light at a wavelength of 400 to 520 nm. Fluorescence having an intensity of about 70% of the maximum intensity and fluorescence having an almost maximum intensity can be obtained by the use of excitation light at a wavelength of 420 to 500 nm and a wavelength of 440 to 480 nm, respectively. Furthermore, fluorescence can also be emitted by the use of near ultraviolet light at a wavelength of 300 to 360 nm. The peak wavelength of fluorescence slightly varies depending on the measuring instrument used, correction conditions or the like, and for the measurement of fluorescence in this claimed invention, a solid quantum efficiency measuring apparatus where an integrating sphere is combined with FP6500 manufactured by JASCO Corp. is used. As for the fluorescence correction, the correction is performed using a secondary standard light source.

The peak wavelength of yellow fluorescence emitted from this ceramic composite for light conversion can be controlled by the composition. As the molar fraction of $CeO_2$ is higher, the peak wavelength of yellow fluorescence is shifted to a longer wavelength side and can be adjusted up to about 560 nm. At the same time, the fluorescence intensity monotonically rises and in this fluorescence peak wavelength range, reduction in the fluorescence intensity does not occur. Meanwhile, in the case of a conventional YAG:Ce fluorescent material powder, the fluorescence peak wavelength can be shifted to the long wavelength side by increasing the amount of the activator Ce, but when the peak wavelength exceeds 550 nm, fluorescence intensity decreases due to concentration quenching. By the ceramic composite for light conversion above, yellow fluorescence allowing for arbitrary adjustment of the peak wavelength in the range of 550 to 560 nm and having strong intensity, which is unobtainable by the conventional adjusted YAG:Ce fluorescent material powder, can be obtained.

The solidified body constituting the ceramic composite light-converting member of the present invention is produced by melting the raw material oxides and solidifying the melt. For example, the solidified body can be obtained by a simple and easy method of charging the melt into a crucible kept at a predetermined temperature and then cooling and congealing it while controlling the cooling temperature, but the solidified body is most preferably produced by a unidirectional solidification method, because when unidirectional solidification is performed, the crystal phase contained continuously grows in a single crystal state and attenuation of light in the member is reduced.

The production method of a ceramic composite light-converting member of the present invention, in one embodiment, comprises mixing an Al oxide, a Y oxide, a Ce oxide and a Gd oxide at a ratio of:

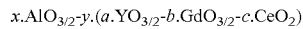
$x.AlO_{3/2}\text{-}y.(a.YO_{3/2}\text{-}b.GdO_{3/2}\text{-}c.CeO_2)$ (wherein x, y, a, b and c are each a molar fraction and satisfy $0.750<x<0.850$, $0<b<0.8$, $0<c<0.3$, $x+y=1$ and $a+b+c=1$); or

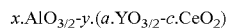
$x.AlO_{3/2}\text{-}y.(a.YO_{3/2}\text{-}c.CeO_2)$ (wherein x, y, a and c are each a molar fraction and satisfy $0.750<x<0.850$, $0.125<c<0.3$, $x+y=1$ and $a+c=1$), melting the mixture, and solidifying the melt.

The solidified body constituting the ceramic composite light-converting member of the present invention may be the same as the ceramic composite material disclosed, for example, in Japanese Unexamined Patent Publication (Kokai) Nos. 7-149597, 7-187893, 8-81257, 8-253389, 8-253390 and 9-67194 previously filed by the applicant of the present invention and their corresponding U.S. applications (U.S. Pat. Nos. 5,569,547, 5,484,752 and 5,902,763) except that at least one phase is a fluorescence-emitting phase, and the solidified body can be produced by the production method disclosed in these patent applications (patents). The contents disclosed in these patent applications and patents are incorporated herein by reference.

As described above, in the ceramic composite light-converting member of the present invention, oxide phases including a fluorescence-emitting phase are continuously and three-dimensionally entangled with each other in a single crystal state, so that homogeneous yellow fluorescence adjusted to a peak wavelength of 540 to 580 nm or a peak wavelength of 550 to 560 nm can be obtained with good efficiency. Since all oxide phases are composed of an inorganic oxide ceramic, heat resistance and durability are excellent and deterioration or the like due to light does not occur. Furthermore, each oxide phase is present in a single crystal state and the boundary of respective phases forms a clear interface without a boundary layer, whereby light is less lost in the ceramic composite light-converting member and the light transmittance is high. Consequently, a ceramic composite light-converting member suitable for the fabrication of a high-efficiency white light-emitting device by combining it with a blue light-emitting element can be provided.

The light-emitting device of the present invention is a device comprising the above-described ceramic composite light-converting member of the present invention and a light-emitting element, where light from the light-emitting element is irradiated on the ceramic composite light-converting member and light transmitted through the ceramic composite light-converting member and fluorescence obtained after wavelength conversion of the light from the light-emitting element by the ceramic composite light-converting, member are utilized. FIG. 1 is a schematic cross-sectional view showing one embodiment of the light-emitting device of the present invention. In the Figure, 1 is a ceramic composite light-converting member, 2 is a light-emitting element (light-emitting diode element), 3 is a lead wire, and 4 is a lead electrode. The bulk (plate-like) ceramic composite light-converting member 1 is disposed at the front of the light-emitting element (light-emitting diode element) 2, whereby a light-emitting device is formed.

The white light-emitting device as one embodiment of the light-emitting device of the present invention comprises a blue-to-violet light-emitting element which emits light having a peak at a wavelength of 400 to 520 nm and the above-described ceramic composite light-converting member which emits yellow fluorescence having a peak wavelength of 540 to 580 nm or a peak wavelength of 550 to 560 nm by utilizing the light emitted from the light-emitting element. The blue-to-violet light emitted from the light-emitting element enters the ceramic composite light-converting member adjusted to such a fluorescence peak wavelength as that a white color can be obtained according to the wavelength of the emitted light. The yellow fluorescence from the excited fluorescence-emitting phase and the blue-to-violet transmitted light are homogeneously mixed by the structure where oxide phases are uniformly distributed in the state of being continuously and three-dimensionally entangled with each other, as a result, a white color with less color unevenness can be obtained.

The ceramic composite light-converting member for use in the white light-emitting device of the present invention is obtained by working the solidified body produced by the above-described method into an appropriate shape such as plate. The color tone of the light-emitting device can be easily controlled by changing the thickness of the member or the like, and fluctuation of the color tone can be easily reduced by keeping the shape precision. The solidified body can be directly used by itself as the member, can be dispensed with a sealing resin, causes no deterioration due to heat or light and therefore, can be combined with a high-output light-emitting element, which enables achieving high output of the white light-emitting device.

The light emitted from the light-emitting element for use in the white light-emitting device of the present invention preferably has a peak at a wavelength of 400 to 520 nm, because excitation of fluorescence from the ceramic composite light-converting member can be obtained at this wavelength. The peak of the light is more preferably present at a wavelength of 420 to 500 nm because higher-intensity fluorescence can be excited, and still more preferably at a wavelength of 440 to 480 nm. At a wavelength in this range, the excitation efficiency of fluorescence of the ceramic composite light-converting member takes a high value and efficient light emission is obtained, which is advantageous for achieving high efficiency of the white light-emitting device.

Examples of the blue-to-violet light-emitting element for use in the white light-emitting device of the present invention include a light-emitting diode element and an element, which generates laser light. A light-emitting diode element is compact and inexpensive and is preferred. When the light-emitting element used is a light-emitting diode element, the white light-emitting device of the present invention is referred to as a white light-emitting diode.

Accordingly, by the white light-emitting device of the present invention, there can be provided a white light-emitting device which can be adjusted to a white color, is reduced in color unevenness and fluctuation, causes no deterioration due to heat or light and is very suitable for achieving high output and high efficiency.

EXAMPLES

The present invention is described in greater detail below by referring to specific examples.

Example 1

An α-$Al_2O_3$ powder (purity: 99.99%) was weighed 0.82 mol in terms of $AlO_{3/2}$, a $Y_2O_3$ powder (purity: 99.9%) was weighed 0.18×0.84 mol in terms of $YO_{3/2}$, a $Gd_2O_3$ powder (purity: 99.9%) was weighed 0.18×0.1 mol in terms of $GdO_{3/2}$, and a $CeO_2$ powder (purity: 99.9%) was weighed 0.18×0.06 mol. These powders were wet mixed in ethanol by a ball mill for 16 hours and then, the ethanol was removed using an evaporator to obtain a raw material powder. This raw material powder was subjected to preparatory melting in a vacuum furnace and used as a raw material for unidirectional solidification.

The raw material was directly charged into a molybdenum crucible and after setting the crucible in a unidirectional solidification apparatus, the raw material was melt-fused under a pressure of $1.33 \times 10^{-3}$ Pa ($10^{-5}$ Torr). In the same atmosphere, the crucible was moved down at a speed of 5 mm/hour to obtain a solidified body comprising three oxide phases, that is, $Al_2O_3$ phase, $(Y,Gd,Ce)_3Al_5O_{12}$ phase and $CeAl_{11}O_{18}$ phase.

Figure 2:
FIG. 2 is a photomicrograph of Example 1 showing one example of the texture structure of the ceramic composite light-converting member of the present invention.

FIG. 2 shows a cross-sectional texture perpendicular to the solidification direction of the solidified body. The black portion A is the $Al_2O_3$ phase, the white portion B is the $(Y,Gd,Ce)_3Al_5O_{12}$ phase, and the gray portion C is the $CeAl_{11}O_{18}$ phase. It is seen that the solidified body has a texture of respective oxide phases being continuously and three-dimensionally entangled with each other and the $(Y,Gd,Ce)_3Al_5O_{12}$ phase as a main fluorescence-emitting phase is uniformly distributed. By virtue of this uniform distribution, homogeneous fluorescence can be obtained.

Figure 3:
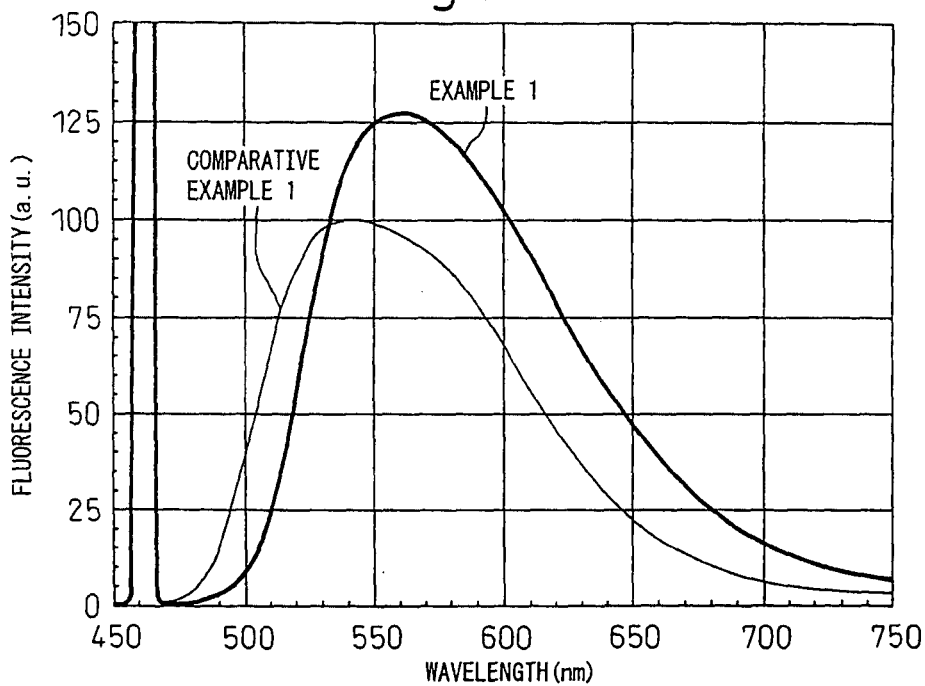
FIG. 3 is a fluorescence spectrum of Example 1 showing one example of the fluorescence characteristics of the ceramic composite light-converting member of the present invention.
Figure 4:
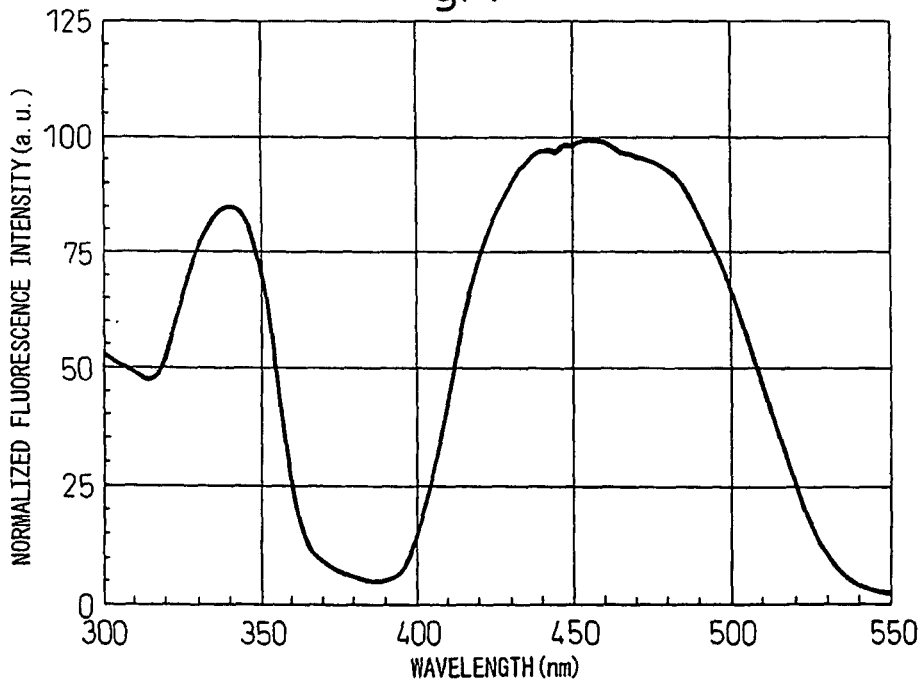
FIG. 4 is an excitation spectrum of Example 1 showing one example of the fluorescence characteristics of the ceramic composite light-converting member of the present invention.

A disc-like sample of φ16 mm×0.2 mm was cut out from the solidified body and evaluated for the fluorescence characteristics by a solid quantum efficiency measuring apparatus manufactured by JASCO Corp. In order to determine the true spectrum, correction was performed using a secondary standard light source. FIG. 3 shows the fluorescence spectrum. The wavelength of the excitation light is 460 nm and the fluorescence intensity is shown by taking the maximum fluorescence intensity of Comparative Example 1 described later as 100. A broad fluorescence spectrum having a peak wavelength at 563 nm and a maximum fluorescence intensity of about 120 is obtained. As seen from comparison with Comparative Example 1, the peak wavelength is shifted about 20 nm to the long wavelength side and an equal or greater value is obtained in the fluorescence intensity. FIG. 4 shows the excitation spectrum for a fluorescence wavelength of 560 nm. The fluorescence intensity is shown by a normalized value by taking the maximum fluorescence intensity as 100. It is seen that fluorescence with nearly maximum intensity is obtained in a wide blue excitation wavelength region of 440 to 480 nm and further that fluorescence is obtained also by excitation light in a violet-to-blue wavelength region of 400 to 440 nm, in a wavelength region of 480 to 520 nm and in a near ultraviolet wavelength region of 360 nm or less.

Fluorescence characteristics are shown in Table 1. In Table 1, the relative fluorescence intensity is shown by a relative value to the maximum fluorescence intensity of Comparative Example 1 described later, which is taken as 100.

TABLE 1

|  | x | y | a | b | c | Fluorescence Peak Wavelength | Relative Fluorescence Intensity | Remarks |
|---|---|---|---|---|---|---|---|---|
| Example 1 | 0.82 | 0.18 | 0.84 | 0.1 | 0.06 | 563 | 127 | |
| 2 | 0.82 | 0.18 | 0.77 | 0.2 | 0.03 | 563 | 115 | |
| 3 | 0.82 | 0.18 | 0.79 | 0.2 | 0.01 | 557 | 103 | |

TABLE 1-continued

| | x | y | a | b | c | Fluorescence Peak Wavelength | Relative Fluorescence Intensity | Remarks |
|---|---|---|---|---|---|---|---|---|
| 4 | 0.82 | 0.18 | 0.57 | 0.4 | 0.03 | 568 | 105 | |
| 5 | 0.78 | 0.22 | 0.35 | 0.6 | 0.15 | 579 | 113 | |
| Comparative Example 1 | 0.82 | 0.18 | 0.997 | 0 | 0.003 | 540 | 100 | |
| 2 | 0.75 | 0.25 | 0.79 | 0.2 | 0.01 | — | — | Good solidified body cannot be obtained. |
| 3 | 0.85 | 0.15 | 0.79 | 0.2 | 0.01 | — | — | Good solidified body cannot be obtained. |
| 4 | 0.82 | 0.18 | 0.37 | 0.8 | 0.03 | 578 | 78 | |
| 5 | 0.82 | 0.18 | 0.8 | 0.2 | 0 | — | — | Fluorescence cannot be obtained. |
| 6 | 0.82 | 0.18 | 0.6 | 0.2 | 0.3 | — | — | Good solidified body cannot be obtained. |

Comparative Example 1

Raw material powders were weighed each to have a molar fraction shown in Table 1 and thereafter, a solidified body having a texture of a plurality of oxide phases being continuously and three-dimensionally entangled with each other was obtained through the same steps as in Example 1. In other words, Comparative Example 1 is an example not containing $GdO_{3/2}$. The fluorescence peak wavelength was 540 nm and by taking the fluorescence intensity here as 100, the relative fluorescence intensity was compared in Examples 1 to 5 and Comparative Example 4.

Examples 2 to 5

Raw material powders were each weighed to have a molar fraction shown in Table 1 and thereafter, a solidified body having a texture of a plurality of oxide phases being continuously and three-dimensionally entangled with each other was obtained through the same steps as in Example 1.

The oxide phase of each Example was composed of 2 to 4 phases including $Al_2O_3$ phase and $(Y,Gd,Ce)_3Al_5O_{12}$ phase. In all of Examples, the oxide phase including a fluorescence-emitting phase was uniformly distributed in the solidified body, and homogeneous fluorescence could be obtained.

The fluorescence characteristics of each Example are shown together in Table 1. It is seen that the fluorescence peak wavelength is shifted to the long wavelength side by increasing the content of $GdO_{3/2}$. Also, as seen from comparison between Examples 2 and 3, when the molar fraction of $GdO_{3/2}$ is constant, the peak wavelength is shifted to the long wavelength side, i.e., from 557 nm to 563 nm, by increasing the molar fraction of $CeO_2$ from 0.01 to 0.03. In this way, by adjusting the contents of $GdO_{3/2}$ and $CeO_2$, the fluorescence peak wavelength can be adjusted over a wide range without sacrificing the relative fluorescence intensity. Furthermore, the fluorescence intensity can be more increased by formulating a specific composition.

Comparative Examples 2 to 6

Raw material powders were weighed each to have a molar fraction shown in Table 1 and thereafter, a solidified body having a texture of a plurality of oxide phases being continuously and three-dimensionally entangled with each other was attempted to obtain through the same steps as in Example 1.

The results are shown in Table 1. In Comparative Examples 2, 3 and 6, the obtained solidified body had cracks and was improper as a ceramic composite light-converting member. In Comparative Example 4 where the molar fraction of $GdO_{3/2}$ was as high as 0.8, the fluorescence peak was shifted to the long wavelength side but because of reduction in the fluorescence intensity, the solidified body was improper as a ceramic composite light-converting member. In Comparative Example 5 where Ce was not contained in the $(Y,Gd,Ce)_3Al_5O_{12}$ phase, the solidified body did not emit fluorescence and was improper as a ceramic composite light-converting member.

Comparative Example 7

An $\alpha$-$Al_2O_3$ powder (purity: 99.99%), a $Y_2O_3$ powder (purity: 99.9%) and a $CeO_2$ powder (purity: 99.9%) were weighed such that the activation amount of Ce became 0.03 mol per mol of $Y_3Al_5O_{12}$. These powders were wet mixed in ethanol by a ball mill for 16 hours and then, the ethanol was removed using an evaporator to obtain a raw material powder. This raw material powder was mixed with 5 parts by weight of barium fluoride ($BaF_2$) as a flux per 100 parts by weight of the raw material, and the mixture was charged into an alumina crucible and fired in the atmosphere at 1,600° C. for 1 hour. From the crucible returned to room temperature, the sample was taken out and washed with a nitric acid solution to remove the flux. In this way, an unadjusted YAG:Ce powder fluorescent material was obtained.

Comparative Example 8

An $\alpha$-$Al_2O_3$ powder (purity: 99.99%), a $Y_2O_3$ powder (purity: 99.9%), a $Gd_2O_3$ powder (purity: 99.9%) and a $CeO_2$ powder (purity: 99.9%) were weighed such that the activation amount of Ce became 0.03 mol per mol of $(Y_{0.8},Gd_{0.2})_3Al_5O_{12}$. These powders were mixed and fired by the method described in Comparative Example 7 to obtain an adjusted YAG:Ce powder fluorescent material.

The fluorescence characteristics of the obtained fluorescent material are shown in Table 2. The fluorescence intensity is shown by the relative value when the maximum fluorescence intensity of Comparative Example 7 is taken as 100. It is seen that in the case of adjusted YAG:Ce powder fluorescent material, as compared with unadjusted YAG:Ce powder fluorescent material, the fluorescence peak wavelength is shifted to the long wavelength side, and at the same time the relative fluorescence is decreased.

TABLE 2

| No. | Compositional Formula | Fluorescence Peak Wavelength (nm) | Relative Fluorescence Intensity | Remarks |
|---|---|---|---|---|
| Comparative Example 7 | $Y_3Al_5O_{12}$:Ce | 542 | 100 | unadjusted YAG:Ce powder fluorescent material |
| Comparative Example 8 | $(Y_{0.8},Gd_{0.2})_3Al_5O_{12}$:Ce | 557 | 74 | adjusted YAG:Ce powder fluorescent material |

Example 6

Figure 5:
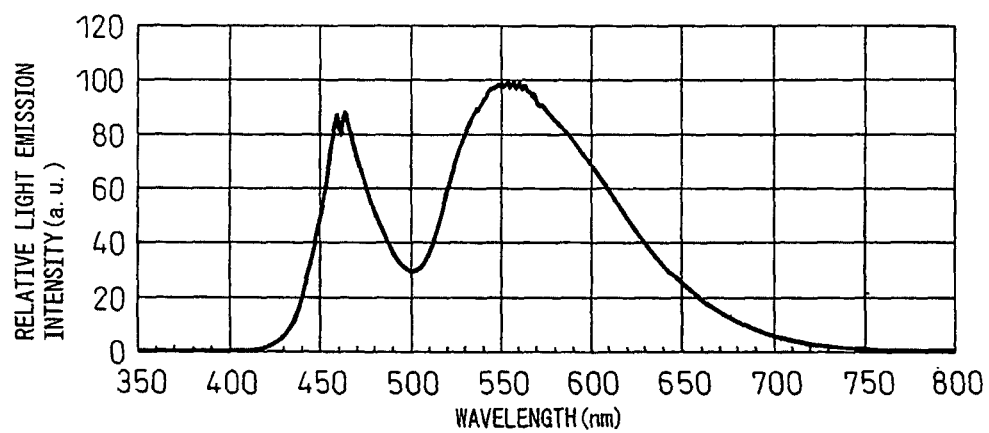
FIG. 5 is a light emission spectrum of Example 6 showing one example of the light-emitting device of the present invention.

The solidified body produced in Example 1 was cut out into predetermined shape and thickness, and a white light-emitting device was fabricated by combining the obtained ceramic composite light-converting member with a blue (463 nm) light-emitting diode element and measured for the light emission spectrum. FIG. 5 shows the light emission spectrum when the thickness of the ceramic composite light-converting member is 0.15 mm. It is recognized that light components having a peak at blue (463 nm) and yellow (560 nm) from the ceramic composite light-converting member, respectively, were mixed. The CIE color coordinates are x=0.33 and y=0.33, indicating that the light was adjusted to white. From these, it is understood that according to the present invention, the chromaticity can be adjusted while keeping the emission efficiency and a light-emitting device with high emission efficiency and preferred chromaticity can be produced.

Example 7

An $\alpha$-$Al_2O_3$ powder (purity: 99.99%) was weighed 0.78 mol in terms of $AlO_{3/2}$, a $Y_2O_3$ powder (purity: 99.9%) was weighed 0.22×0.85 mol in terms of $YO_{3/2}$, and a $CeO_2$ powder (purity: 99.9%) was weighed 0.22×0.15 mol. These powders were wet mixed in ethanol by a ball mill for 16 hours and then, the ethanol was removed using an evaporator to obtain a raw material powder. This raw material powder was subjected to preparatory melting in a vacuum furnace and used as a raw material for unidirectional solidification.

The raw material was directly charged into a molybdenum crucible and after setting the crucible in a unidirectional solidification apparatus, the raw material was melt-fused under a pressure of $1.33×10^{-3}$ Pa ($10^{-5}$ Ton). In the same atmosphere, the crucible was moved down at a speed of 5 mm/hour to obtain a solidified body comprising three oxide phases, that is, $Al_2O_3$ phase, $(Y,Ce)_3Al_5O_{12}$ phase and $CeAl_{11}O_{18}$ phase.

Figure 6:
FIG. 6 is a micrograph of Example 7 showing one example of the texture structure of the ceramic composite for light conversion of the present invention.

FIG. 6 shows a cross-sectional texture perpendicular to the solidification direction of the solidified body. The black portion A is the $Al_2O_3$ phase, the white portion B is the $(Y,Ce)_3Al_5O_{12}$ phase, and the gray portion C is the $CeAl_{11}O_{18}$ phase. It is seen that the solidified body has a texture of respective oxide phases being continuously and three-dimensionally entangled with each other and the $(Y,Ce)_3Al_5O_{12}$ phase as a main fluorescence-emitting phase is uniformly distributed. By virtue of this uniform distribution, homogeneous fluorescence can be obtained.

A disc-like sample of 416 mm×0.2 mm was cut out from the solidified body and evaluated for the fluorescence characteristics by a solid quantum efficiency measuring apparatus manufactured by JASCO Corp. In order to determine the true spectrum, correction was performed using a secondary standard light source. FIG. 7 shows the fluorescence spectrum. The wavelength of the excitation light is 460 nm and the fluorescence intensity is shown by taking the maximum fluorescence intensity of Comparative Example 11 described later as 100. A broad fluorescence spectrum having a peak wavelength at 558 nm and a maximum fluorescence intensity of about 120 is obtained. As seen from comparison with Comparative Example 11, the peak wavelength is shifted about 10 nm to the long wavelength side and at the same time, the fluorescence intensity is increased. FIG. 8 shows the excitation spectrum for a fluorescence wavelength of 560 nm. The fluorescence intensity is shown by a normalized value by taking the maximum fluorescence intensity as 100. It is seen that fluorescence with nearly maximum intensity is obtained in a wide blue excitation wavelength region of 440 to 480 nm and further that fluorescence is obtained also by excitation light in a violet-to-blue wavelength region of 400 to 440 nm, in a wavelength region of 480 to 520 nm and in a near ultraviolet wavelength region of 360 nm or less.

Fluorescence characteristics are shown in Table 3. In Table 3, the relative fluorescence intensity is shown by a relative value to the maximum fluorescence intensity of Comparative Example 11 described later, which is taken as 100.

TABLE 3

| No. | x | y | a | c | Fluorescence Peak Wavelength (nm) | Relative Fluorescence Intensity | Remarks |
|---|---|---|---|---|---|---|---|
| Example 7 | 0.78 | 0.22 | 0.85 | 0.15 | 558 | 120 | |
| Example 8 | 0.82 | 0.18 | 0.875 | 0.125 | 550 | 110 | |
| Comparative Example 9 | 0.75 | 0.25 | 0.99 | 0.01 | — | — | Good solidified body cannot be obtained. |
| Comparative Example 10 | 0.85 | 0.15 | 0.99 | 0.01 | — | — | Good solidified body cannot be obtained. |
| Comparative Example 11 | 0.82 | 0.18 | 0.97 | 0.03 | 547 | 100 | |
| Comparative Example 12 | 0.82 | 0.18 | 0.7 | 0.3 | — | — | Good solidified body cannot be obtained. |

Example 8

Raw material powders were weighed each to have a molar fraction shown in Table 3 and thereafter, a solidified body having a texture of a plurality of oxide phases being continuously and three-dimensionally entangled with each other was obtained through the same steps as in Example 7.

The oxide phase was composed of $Al_2O_3$ phase, $(Y,Ce)_3Al_5O_{12}$ phase and $CeAl_{11}O_{18}$ phase. The oxide phase including a fluorescence-emitting phase was uniformly distributed in the solidified body, and homogeneous fluorescence could be obtained.

The fluorescence characteristics are shown together in Table 3. It is seen that the fluorescence peak wavelength is shifted to the long wavelength side by increasing the content of $CeO_2$.

Comparative Examples 9 to 12

Raw material powders were weighed each to have a molar fraction shown in Table 3 and thereafter, a solidified body having a texture of a plurality of oxide phases being continuously and three-dimensionally entangled with each other was attempted to obtain through the same steps as in Example 7.

The results are shown in Table 3. In Comparative Examples 9, 10 and 12, the obtained solidified body had cracks and was improper as a ceramic composite for light conversion. In Comparative Example 11 where the molar fraction of $CeO_2$ was as low as 0.03, the fluorescence peak became shorter than 550 nm and the solidified body was improper as a ceramic composite for light conversion used in a white light-emitting device.

Comparative Example 13

An $\alpha$-$Al_2O_3$ powder (purity: 99.99%), a $Y_2O_3$ powder (purity: 99.9%) and a $CeO_2$ powder (purity: 99.9%) were weighed to become $(Y_{0.95}Ce_{0.05})_3Al_5O_{12}$. These powders were wet mixed in ethanol by a ball mill for 16 hours and then, the ethanol was removed using an evaporator to obtain a raw material powder. This raw material powder was mixed with 5 parts by weight of barium fluoride ($BaF_2$) as a flux per 100 parts by weight of the raw material, and the mixture was charged into an alumina crucible and fired in the atmosphere at 1,600° C. for 1 hour. From the crucible returned to room temperature, the sample was taken out and washed with a nitric acid solution to remove the flux. In this way, YAG:Ce Powder Fluorescent Material 1 was obtained.

Comparative Example 14

An $\alpha$-$Al_2O_3$ powder (purity: 99.99%), a $Y_2O_3$ powder (purity: 99.9%), a $Gd_2O_3$ powder (purity: 99.9%) and a $CeO_2$ powder (purity: 99.9%) were weighed to become $(Y_{0.9},Ce_{0.1})_3Al_5O_{12}$. These powders were mixed and fired by the method described in Comparative Example 13 to obtain adjusted YAG:Ce Powder Fluorescent Material 2.

The fluorescence characteristics of the fluorescent materials obtained in Comparative Examples 13 and 14 are shown together in Table 4. The fluorescence intensity is shown by the relative value when the maximum fluorescence intensity of Comparative Example 13 is taken as 100. It is seen that in the case of YAG:Ce Powder Fluorescent Material 2, as compared with unadjusted YAG:Ce Powder Fluorescent Material 1, the fluorescence peak wavelength is 555 nm and is shifted about 10 nm to the long wavelength side but at the same time, the relative fluorescence is greatly decreased.

TABLE 4

| No. | | Fluorescence Peak Wavelength (nm) | Relative Fluorescence Intensity | |
|---|---|---|---|---|
| Comparative Example 13 | $(Y_{0.95},Ce_{0.05})_3Al_5O_{12}$ | 543 | 100 | YAG:Ce Powder Fluorescent Material 1 |
| Comparative Example 14 | $(Y_{0.9},Ce_{0.1})_3Al_5O_{12}$ | 555 | 69 | YAG:Ce Powder Fluorescent Material 2 |

Example 9

Figure 9:
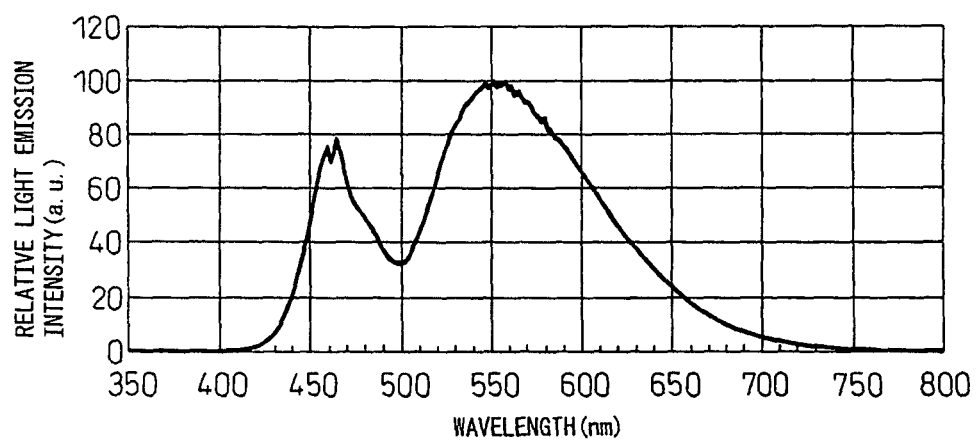
FIG. 9 is a light emission spectrum of Example 9 showing one example of the light-emitting device of the present invention.

The solidified body produced in Example 7 was cut out into predetermined shape and thickness, and a white light-emitting device was fabricated by combining the obtained ceramic composite for light conversion with a blue (463 nm) light-emitting diode element and measured for the light emission spectrum. FIG. 9 shows the light emission spectrum when the thickness of the ceramic composite for light conversion is 0.10 mm. It is recognized that light components having a peak at blue (463 nm) and yellow (558 nm) from the ceramic composite for light conversion, respectively, were mixed. The CIE color coordinates are x=0.33 and y=0.33, indicating that the light was adjusted to white. From these, it is understood that according to the present invention, the chromaticity can be adjusted while keeping the emission efficiency and a light-emitting device with high emission efficiency and preferred chromaticity can be produced.

INDUSTRIAL APPLICABILITY

The ceramic composite light-converting member and light-emitting device of the present invention can be used in a display, a light, a backlight source and the like.

The invention claimed is:

1. A ceramic composite light-converting member having no cracks comprising a ceramic composite which is a solidified body having a texture of at least two or more oxide phases being continuously and three-dimensionally entangled with each other, where at least one of said oxide phases is a fluorescence-emitting phase of $(Y,Gd,Ce)_3Al_5O_{12}$ and the composition of the ceramic composite as a whole is represented by:

$$x \cdot AlO_{3/2} \cdot y \cdot (a \cdot YO_{3/2} \cdot b \cdot GdO_{3/2} \cdot c \cdot CeO_2)$$

(wherein x, y, a, b and c are each a molar fraction and satisfy $0.750 < x < 0.850$, $0.1 \leq b \leq 0.6$, $0 < c \leq 0.15$, $x+y=1$ and $a+b+c=1$), said ceramic composite having the fluorescent peak wavelength of 540 nm or more.

2. The ceramic composite light-converting member as claimed in claim 1, which is a bulk body.

3. The ceramic composite light-converting member as claimed in claim 1, which is in a plate shape.

4. A method for producing a ceramic composite light-converting member as set forth in claim 1, comprising the steps of mixing an Al oxide, a Y oxide, a Ce oxide and a Gd oxide at a ratio of:

$$x.AlO_{3/2}\text{-}y.(a.YO_{3/2}\text{-}b.GdO_{3/2}\text{-}c.CeO_2)$$

(wherein x, y, a, b and c are each a molar fraction and satisfy $0.750<x<0.850$, $0.1 \le b \le 0.6$, $0<c \le 0.15$, $x+y-1$ and $a+b+c=1$), melting the mixture and solidifying the resultant melt.

5. A light-emitting device comprising a light-emitting element and the ceramic composite light-converting member as claimed in claim 1.

6. The light-emitting device as claimed in claim 5, wherein said ceramic composite light-converting member in a plate shape is disposed at the front of said light-emitting element.

7. A white light-emitting device comprising a light-emitting element which emits light having a peak at a wavelength of 400 to 520 nm and the ceramic composite light-converting member claimed in claim 1 which emits fluorescence having a peak at a wavelength of 540 to 580 nm.

8. The white light-emitting device as claimed in claim 7, wherein said light-emitting element is a light-emitting diode element.

9. The ceramic composite light conversion member according to claim 1, wherein $0.18 \le y \le 0.22$.

10. The ceramic composite light conversion member according to claim 1, wherein said ceramic composite light conversion member has a plurality of oxide phases of $Al_2O_3$ phase $(Y,Gd,Ce)_3Al_5O_{12}$ phase and $CeAl_{11}O_{18}$ phase.

* * * * *

UNITED STATES PATENT AND TRADEMARK OFFICE
CERTIFICATE OF CORRECTION

| | | |
|---|---|---|
| PATENT NO. | : 8,608,978 B2 | Page 1 of 1 |
| APPLICATION NO. | : 12/161403 | |
| DATED | : December 17, 2013 | |
| INVENTOR(S) | : Mitani et al. | |

It is certified that error appears in the above-identified patent and that said Letters Patent is hereby corrected as shown below:

In the Specification

In Column 14

At line 22, please change "416" to --ϕ16--.

Signed and Sealed this
Seventeenth Day of June, 2014

Michelle K. Lee
*Deputy Director of the United States Patent and Trademark Office*